US012566194B2

(12) United States Patent
Yang et al.

(10) Patent No.: US 12,566,194 B2
(45) Date of Patent: Mar. 3, 2026

(54) HALL SENSOR FIXING MEMBER AND HALL SENSOR ASSEMBLY

(71) Applicant: Microvast, Inc., Stafford, TX (US)

(72) Inventors: Wanyi Yang, Huzhou (CN); Cheng Zhong, Huzhou (CN)

(73) Assignee: MICROVAST, INC., Stafford, TX (US)

( * ) Notice: Subject to any disclaimer, the term of this patent is extended or adjusted under 35 U.S.C. 154(b) by 138 days.

(21) Appl. No.: 18/292,344

(22) PCT Filed: Jul. 28, 2021

(86) PCT No.: PCT/CN2021/109084
§ 371 (c)(1),
(2) Date: Jan. 26, 2024

(87) PCT Pub. No.: WO2023/004654
PCT Pub. Date: Feb. 2, 2023

(65) Prior Publication Data
US 2024/0377439 A1     Nov. 14, 2024

(51) Int. Cl.
*G01R 15/20*          (2006.01)
*G01R 19/00*          (2006.01)
(52) U.S. Cl.
CPC ....... *G01R 15/202* (2013.01); *G01R 19/0092* (2013.01)
(58) Field of Classification Search
CPC ........................... G01R 19/0092; B25B 27/00
See application file for complete search history.

(56) References Cited

U.S. PATENT DOCUMENTS

| 5,653,601 | A | * | 8/1997 | Martucci | .............. | H01R 12/716 |
| | | | | | | 439/82 |
| 2007/0232137 | A1 | * | 10/2007 | Skarlupka | ................ | H01R 4/10 |
| | | | | | | 439/578 |
| 2009/0278526 | A1 | * | 11/2009 | Yoshida | ............... | G01R 15/202 |
| | | | | | | 324/117 H |
| 2014/0077797 | A1 | * | 3/2014 | Nagao | .................... | G01R 19/15 |
| | | | | | | 324/253 |
| 2015/0162686 | A1 | * | 6/2015 | Qian | ...................... | H01R 12/79 |
| | | | | | | 29/857 |

FOREIGN PATENT DOCUMENTS

| CN | 203215036 U | 9/2013 |
| CN | 103661129 A | 3/2014 |

(Continued)

*Primary Examiner* — Dominic E Hawkins
(74) *Attorney, Agent, or Firm* — Andrew C. Cheng

(57)          ABSTRACT

A Hall sensor fixing member, used for fixing a Hall sensor to a metal piece. A mounting hole into which the Hall sensor fixing member is inserted is formed in the Hall sensor. The Hall sensor fixing member is made of an elastic material. A through hole into which the metal piece is inserted is axially formed in the interior of the Hall sensor fixing member. The size of the through hole is less than the size of the metal piece. When the metal piece is inserted into the through hole by squeezing, the Hall sensor fixing member is elastically deformed and expands outward under the action of squeezing by the metal piece, such that the outer wall of the Hall sensor fixing member and the inner wall of the mounting hole of the Hall sensor abut against to each other and are thus fixed.

11 Claims, 4 Drawing Sheets

(56)　　　　　　　References Cited

FOREIGN PATENT DOCUMENTS

| CN | 104440050 | A  | 3/2015 |
|----|-----------|----|--------|
| CN | 109435593 | A  | 3/2019 |
| CN | 110082433 | A  | 8/2019 |
| CN | 210978118 | U  | 7/2020 |
| CN | 213473277 | U  | 6/2021 |
| JP | 2009166702 | A | 7/2009 |
| KR | 101992324 | B1 | 7/2019 |

* cited by examiner

HALL SENSOR FIXING MEMBER AND HALL SENSOR ASSEMBLY

CROSS REFERENCE TO RELATED APPLICATIONS

This application is a 35 U.S.C. § 371 National Phase conversion of International (PCT) Patent Application No. PCT/CN2021/109084, filed on Jul. 28, 2021. The PCT International Patent Application was filed and published in Chinese.

TECHNICAL FIELD

The present application relates to the technical field of sensor installation, and in particular, to a Hall sensor fixing member and a Hall sensor assembly.

BACKGROUND

Hall sensor is a magnetic field sensor made based on the Hall effect, usually used to detect the magnitude of current. Hall sensors are widely used in industrial automation technology, detection technology, and information processing technology and other fields.

High voltage control box is a commonly used component in transmission lines. Generally, a specially designed bracket is installed inside the high voltage control box for fixing the Hall sensor. When current needs to be detected, the Hall sensor is fixed inside the high voltage control box through the bracket to achieve current detection by the Hall sensor.

Technical Problem

The bracket inside the high-voltage control box, during installation, needs a fixed supporting surface as well as a layout space, which not only makes it difficult to arrange the components inside the high-voltage control box, but also leads to problems that the high-voltage control box will have large external dimensions, increased weight, and increased cost after layout. Meanwhile, when fixing the Hall sensor on the bracket, it requires the use of screws, ties and other parts to assist installation, which not only makes operation inconvenient but also increases the assembly process.

Technical Solution

The object of the present application is to provide a Hall sensor fixing member and a Hall sensor assembly, aiming to solve the shortcomings of the background mentioned above. The Hall sensor fixing member is used to fix the Hall sensor to a metal piece, which not only has good safety performance, easy installation and disassembly, good fastening performance, and high reliability, but also has a simple structure and good universality, reducing production and manufacturing costs and occupying less space.

An embodiment of the present application provides a Hall sensor fixing member for fixing a Hall sensor to a metal piece, and the Hall sensor is provided with a mounting hole for inserting the Hall sensor fixing member. The Hall sensor fixing member is made of an elastic material. A through slot is provided in the Hall sensor fixing member along the axial direction for inserting the metal piece. A size of the through slot is smaller than that of the metal piece. When the metal piece is inserted into the through slot by squeezing, the Hall sensor fixing member is elastically deformed and expands outward under squeezing effect of the metal piece, causing an outer wall of the Hall sensor fixing member to abut against and be fixed to an inner wall of the mounting hole of the Hall sensor.

In an achievable manner, the Hall sensor fixing member has a columnar structure.

In an achievable manner, the Hall sensor fixing member has a cylindrical structure.

In an achievable manner, the Hall sensor fixing member is made of insulating flame-retardant material.

In an achievable manner, the material of the Hall sensor fixing member is silicone or rubber.

In an achievable manner, the outer wall of the Hall sensor fixing member is provided with a groove, and the Hall sensor is clamped in the groove during fixing. The outer wall of the Hall sensor fixing member at the position of the groove abuts against the inner wall of the Hall sensor.

In an achievable manner, the outer wall of the Hall sensor fixing member protrudes radially to form a limiting portion, and the limiting portion is used to abut against an end face of the Hall sensor, thereby achieving the limiting effect of the Hall sensor along the axial direction of the Hall sensor fixing member.

In an achievable manner, the limiting portion includes a first limiting portion and a second limiting portion which are spaced apart from each other. The first limiting portion and the second limiting portion respectively correspond to two ends of the Hall sensor fixing member. The first limiting portion and the second limiting portion respectively abut against two end faces of the Hall sensor.

In an achievable manner, the outer wall of the Hall sensor fixing member is provided with a groove, and the groove is provided between the first limiting portion and the second limiting portion. The Hall sensor is clamped in the groove, and the outer wall of the Hall sensor fixing member at the position of the groove abuts against the inner wall of the Hall sensor.

In an achievable manner, the Hall sensor fixing member includes at least two clamp blocks that are separated from or connected to each other. When the at least two clamp blocks are inserted into the mounting hole, a gap is formed between the at least two clamp blocks, and the through slot is formed by the gap.

In an achievable manner, the number of the clamping blocks is two, and the two clamping blocks are arranged opposite to each other. The through slot is formed by a gap between the two clamping blocks.

In an achievable manner, an uneven structure is provided on an inner wall of the through slot for easy insertion and removal of the metal piece. This facilitates disassembly and connection of the Hall sensor fixing member and the metal piece.

In an achievable manner, the uneven structure includes multiple protrusions that are spaced apart from each other. The protrusions are elongated structures extending along the axial direction of the Hall sensor fixing member, and a concave is formed between adjacent two protrusions.

Another embodiment of the present application further provides a Hall sensor assembly including a Hall sensor and a metal piece. The Hall sensor is provided with a mounting hole. The Hall sensor assembly further includes the Hall sensor fixing member as described above. The Hall sensor fixing member is inserted into the mounting hole, and the metal piece is inserted into the through slot.

Beneficial Effects

The Hall sensor fixing member provided in this application is made of an elastic material, and there is a through slot in the Hall sensor fixing member. The size of the through slot is smaller than that of the metal piece. When the metal piece is inserted into the through slot by squeezing, the metal piece can form a squeezing effect on the Hall sensor fixing member. The Hall sensor fixing member is elastically deformed and expands outward under the squeezing effect of the metal piece. Meanwhile, the Hall sensor fixing member forms a squeezing effect on the inner wall of the Hall sensor, so that the Hall sensor, the Hall sensor fixing member and the metal piece are fixed together, thereby fixing the Hall sensor to the metal piece. When it is necessary to remove the Hall sensor from the metal piece, it is only required to simply pull the metal piece out of the through slot.

The Hall sensor fixing member provided in this application not only has good safety performance, easy installation and disassembly, good fastening performance, and high reliability, but also has a simple structure and good universality, and with only one-time design and mold making, it can be mass-produced, greatly reducing production costs. Meanwhile, the bracket used to fix the Hall sensor is eliminated, reducing the internal occupied space of the high-voltage control box, solving the problem of difficult component layout inside the high-voltage control box, reducing the external dimensions of the high-voltage control box, and improving the adaptability of the installation and layout of the high-voltage control box in the entire vehicle.

In the figures: 1—Hall sensor fixing member; 11—through slot; 12—limiting portion; 121—first limiting portion; 122—second limiting portion; 13—groove; 14—clamp block; 15—protrusion; 16—concave; 2—Hall sensor; 21—mounting hole; 3—metal piece.

DETAILED DESCRIPTION OF THE EMBODIMENTS

The following will provide a further detailed description of the specific implementations of the present application in conjunction with the accompanying drawings and embodiments. The following embodiments are used to illustrate the present application, but are not intended to limit the scope of the present application.

The terms "first", "second", "third", "fourth", etc. (if any) in the specification and claims of the present application are only used to distinguish similar objects, and are not intended to be used to describe a specific sequence or order.

The terms "up", "down", "left", "right", "front", "back", "top", "bottom" (if any) in the specification and claims of the present application are defined based on the position of the structure in the figures and the position of the structures in relation to each other, which are only for the clarity and convenience of expressing the technical solution. It should be understood that the use of these directional words should not limit the scope of protection in the present application.

Figure 1:
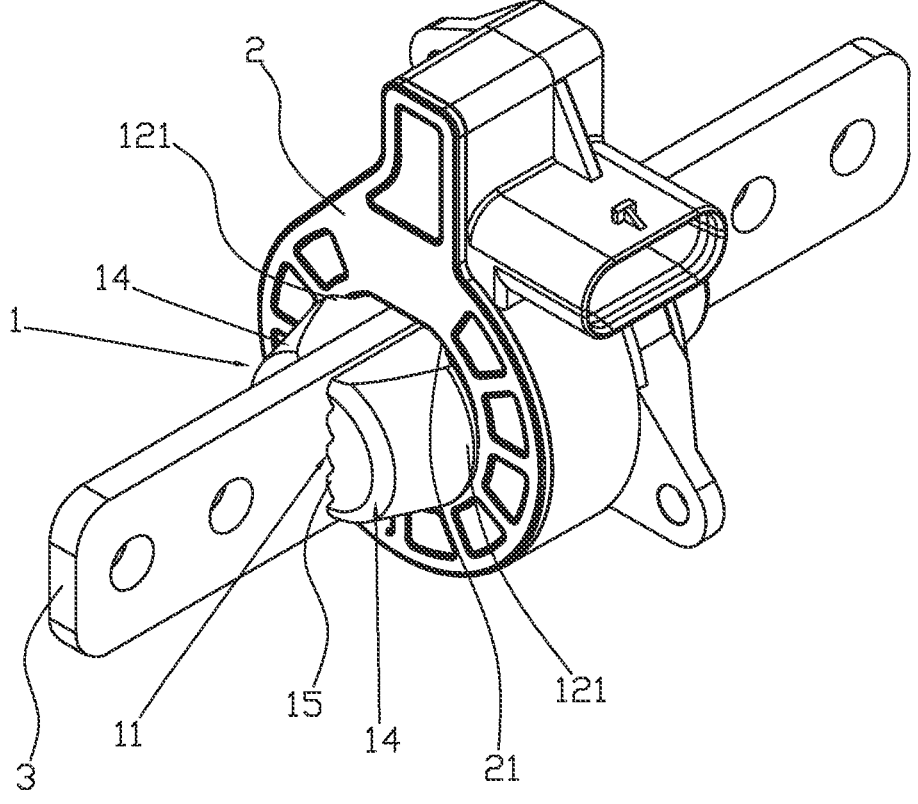
FIG. 1 is a schematic diagram of the three-dimensional structure of a Hall sensor assembly in the first embodiment of the present application.
Figure 2:
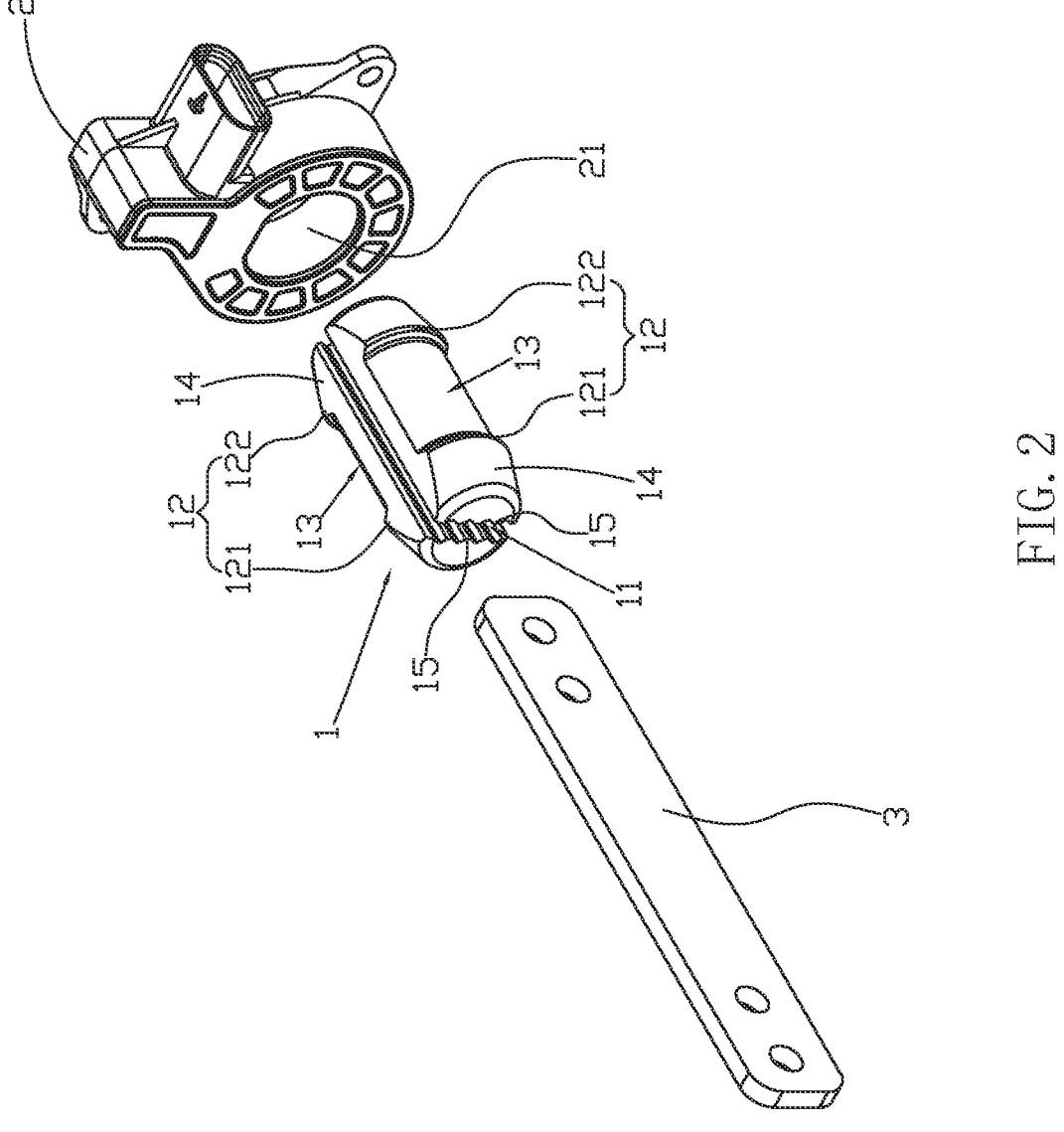
FIG. 2 is a schematic diagram of the explosive structure of FIG. 1.

As shown in FIG. 1 and FIG. 2, a Hall sensor fixing member 1 provided in the first embodiment of the present application is used to fix a Hall sensor 2 to a metal piece 3. The Hall sensor 2 is provided with a mounting hole 21 for inserting the Hall sensor fixing member 1. The Hall sensor fixing member 1 is made of an elastic material. A through slot 11 is provided in the Hall sensor fixing member 1 along the axial direction for inserting the metal piece 3, and the size of the through slot 11 is smaller than that of the metal piece 3. When the metal piece 3 is inserted into the through slot 11 by squeezing, the Hall sensor fixing member 1 is elastically deformed and expands outward under the squeezing effect of the metal piece 3. Meanwhile, the Hall sensor fixing member 1 forms a squeezing effect on the inner wall of the mounting hole 21 of the Hall sensor 2, causing the outer wall of the Hall sensor fixing member 1 to abut against and be fixed to the inner wall of the mounting hole 21 of the Hall sensor 2.

Specifically, the metal piece 3 can be electrical connectors such as copper busbars or aluminum busbars. The Hall sensor fixing member 1 is an elastic member. When the metal piece 3 is inserted into the through slot 11 by squeezing, the Hall sensor fixing member 1 can undergo elastic deformation and generate squeezing force and recovery force. The squeezing force and recovery force act on the Hall sensor 2 and the metal piece 3 respectively, making the fixing between the metal piece 3 and the Hall sensor 2 more stable. During assembly, the metal piece 3 to be tested is inserted into the through slot 11, the metal piece 3 exerts a squeezing effect on the Hall sensor fixing member 1, and at the same time, the Hall sensor fixing member 1 also exerts a squeezing effect on the inner wall of the Hall sensor 2, thereby fixing the Hall sensor 2, the Hall sensor fixing member 1 and the metal piece 3 together, thus fixing the Hall sensor 2 to the metal piece 3. When it is necessary to remove the Hall sensor 2 from the metal piece 3, it is required to simply pull the metal piece 3 out of the through slot 11.

As shown in FIG. 2, in an achievable manner, the Hall sensor fixing member 1 has a columnar structure to match the shape of the mounting hole 21 of the Hall sensor 2. Specifically, in this embodiment, the Hall sensor fixing member 1 has a cylindrical structure. Of course, in other embodiments, when the mounting hole 21 of the Hall sensor 2 is of other shapes, the Hall sensor fixing member 1 can also be of other corresponding shapes.

As shown in FIG. 1 to FIG. 4, in an achievable manner, the outer wall of the Hall sensor fixing member 1 protrudes radially to form a limiting portion 12, and the limiting portion 12 is used to abut against the end faces of the Hall sensor 2. The limiting portion 12 is used to prevent the Hall sensor fixing member 1 from sliding in the mounting hole 21, and to make the fixing between the Hall sensor fixing member 1 and the Hall sensor 2 more stable, preventing the Hall sensor fixing member 1 from sliding in the mounting hole 21 during use.

As shown in FIG. 1 to FIG. 4, in an achievable manner, the limiting portion 12 includes a first limiting portion 121 and a second limiting portion 122 that are spaced apart from each other. The first limiting portion 121 and the second limiting portion 122 respectively correspond to two ends of the Hall sensor fixing member 1. The first limiting portion 121 and the second limiting portion 122 respectively abut against the two end faces of the Hall sensor 2. Of course, in other embodiments, the limiting portion 12 can also be set at only one end of the Hall sensor fixing member 1, and the limiting portion 12 is arranged at one end of the Hall sensor fixing member 1 from which the metal piece 3 is inserted to prevent the Hall sensor fixing member 1 from sliding in the mounting hole 21 when the metal piece 3 is inserted into the through slot 11.

Figure 3:
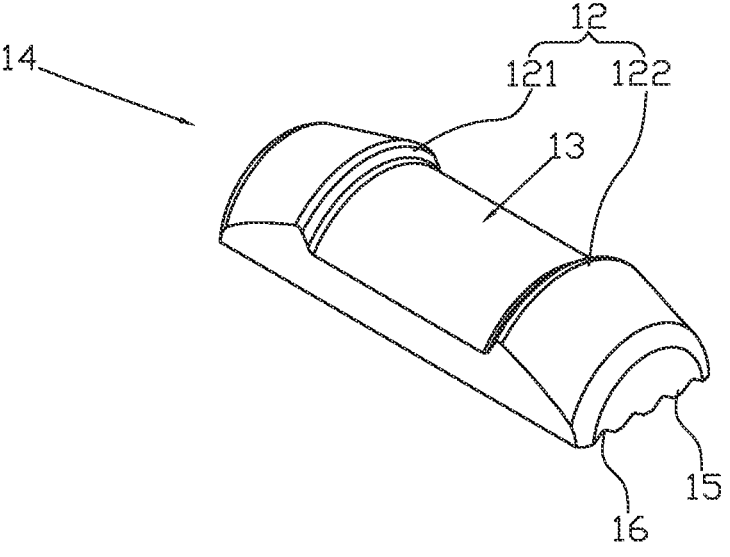
FIG. 3 is a structural schematic of the clamp block in FIG. 2.
Figure 4:
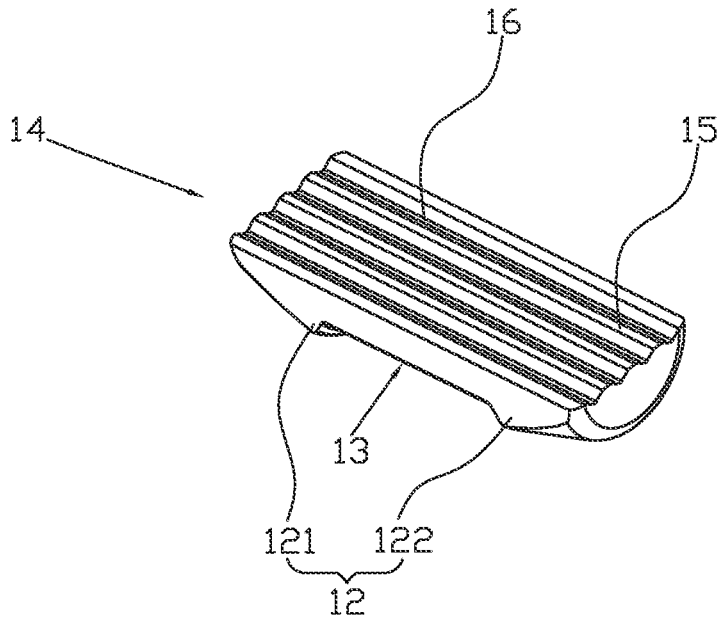
FIG. 4 is another structural schematic of the clamp block in FIG. 2.

As shown in FIG. 2 to FIG. 4, in an achievable manner, the outer wall of the Hall sensor fixing member 1 is provided with a groove 13, and the groove 13 is provided between the first limiting portion 121 and the second limiting portion 122. The Hall sensor 2 is clamped in the groove 13, and the outer wall of the Hall sensor fixing member 1 at the position of the groove 13 abuts against the inner wall of the Hall sensor 2.

As shown in FIG. 1 to FIG. 4, in an achievable manner, the first limiting portion 121 and the second limiting portion 122 are two steps, wherein the two steps are both formed on the outer wall of the Hall sensor fixing member 1, and the two steps are respectively arranged on two sides of the groove 13. The size of the outer diameter of the Hall sensor fixing member 1 at the position of the groove 13 is not unique. The size of the outer diameter can be determined by the size of the inner diameter of the mounting hole 21 of the Hall sensor 2. After the metal piece 3 is inserted into the through slot 11, the inner wall of the mounting hole 21 of the Hall sensor 2 abuts against the bottom wall of the groove 13, and the two steps clamp the two end faces of the Hall sensor 2. Of course, in other embodiments, the limiting portion 12 may also be a protruding structure, clamp, etc.

In an achievable manner, the Hall sensor fixing member 1 is made of insulating and flame-retardant elastic material.

Specifically, the Hall sensor fixing member 1 can be made of insulating and flame-retardant elastic materials such as flame-retardant silicone and flame-retardant rubber. Due to their excellent insulation performance, when the Hall sensor fixing member 1 is installed in a high-voltage control box, there is no need to consider the issues of insulation and electrical clearance, and there is no safety risk involved. Meanwhile, the Hall sensor fixing member 1 can meet the flame-retardant performance requirements, such as the safety performance requirements of horizontal HB level and vertical V-0 level.

As shown in FIG. 2 and FIG. 4, in an achievable manner, an uneven structure is provided on the inner wall of the through slot 11 for facilitating insertion and removal of the metal piece 3.

As shown in FIG. 4, in an achievable manner, the uneven structure includes multiple protrusions 15 that are spaced apart from each other. The protrusions 15 are elongated structures extending along the axial direction of the Hall sensor fixing member 1. A concave 16 is formed between adjacent two protrusions 15. Of course, in other embodiments, the uneven structure can also be other uneven structures, so that the inner wall of the Hall sensor fixing member 1 forms an uneven surface. The uneven structure can also be structures such as bumps, grooves, etc.

Specifically, since the metal piece 3 is generally a long strip structure with flat surfaces, and meanwhile, the Hall sensor fixing member 1 is an elastic structure, if the inner wall of the Hall sensor fixing member 1 adopts a flat structure, the metal piece 3 will be attached to the inner wall of the Hall sensor fixing member 1, making it difficult for the metal piece 3 to be inserted into the through slot 11. By setting multiple protrusions 15 on the inner wall of the Hall sensor fixing member 1, the contact area between the metal piece 3 and the inner wall of the Hall sensor fixing member 1 is reduced, and meanwhile, the protrusions 15 can play a guiding role when inserting the metal piece 3, making it easier for the metal piece 3 to be inserted into the through slot 11.

As shown in FIG. 1 and FIG. 2, in an achievable manner, the Hall sensor fixing member 1 includes at least two clamp blocks 14 that are separated from each other. When the at least two clamp blocks 14 are inserted into the mounting hole 21, a gap is formed between the at least two clamp blocks 14, and the through slot 11 is formed by the gap.

As shown in FIG. 1 and FIG. 2, in an achievable manner, the number of the clamp blocks 14 is two, and the two clamp blocks 14 are arranged opposite to each other. The through slot 11 is formed by the gap between the two clamp blocks 14, and the metal piece 3 is clamped between the two clamp blocks 14. Of course, in other embodiments, the number of the clamp blocks 14 can be more, such as three, four, or more, and the number of the clamp blocks 14 can be determined according to actual needs.

Figure 5:
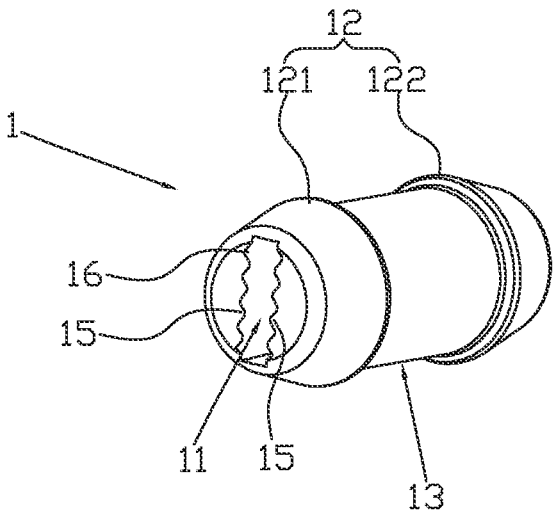
FIG. 5 is a schematic diagram of the three-dimensional structure of a Hall sensor fixing member in the second embodiment of the present application.

In other embodiments, the Hall sensor fixing member 1 may also include at least two clamp blocks 14 that are connected to each other, and the clamp blocks 14 are connected by a connecting part on at least one side of the through slot 11. For example, the number of the clamp blocks 14 is two, and the two clamp blocks 14 are arranged opposite to each other, and a connecting part is provided between the two clamp blocks 14 on one side of the through slot 11 to connect the two clamp blocks 14; alternatively, connecting parts are respectively provided between the two clamping blocks 14 on both sides of the through slot 11 to connect the two clamp blocks 14 (as shown in FIG. 5). The connecting part can be made of an elastic material, so it does not affect the fixing of the Hall sensor fixing member 1.

As shown in FIG. 2 to FIG. 4, in an achievable manner, the inner wall of each clamp block 14 is provided with multiple protrusions 15, and the outer wall of each clamp block 14 is provided with the limiting portion 12 and the groove 13. Both sides of each clamp block 14 along one radial direction (i.e., the top and bottom of the clamp block 14 as shown in FIG. 2) can have a planar structure, or an arc-shaped structure.

Specifically, since the size of the outer diameter of the Hall sensor fixing member 1 is generally similar to the size of the inner diameter of the mounting hole 21 of the Hall sensor 2, and the outer wall of the Hall sensor fixing member 1 is provided with a limiting portion 12, by separating the Hall sensor fixing member 1 into two clamping blocks 14, it is convenient for the Hall sensor fixing member 1 to be installed in the mounting hole 21 of the Hall sensor 2. Specifically, during installation, the two clamp blocks 14 are first respectively installed in the mounting hole 21, so that the Hall sensor 2 is clamped in the grooves 13 of the clamp blocks 14; then, the metal piece 3 to be tested is inserted into the gap between the two clamp blocks 14. When the metal piece 3 is inserted into the gap between the two clamp blocks 14, the metal piece 3 can simultaneously squeeze the two clamp blocks 14 to fix the Hall sensor 2 to the metal piece 3. When the Hall sensor 2 needs to be removed from the metal piece 3, it is only required to simply pull the metal piece 3 out of the gap between the two clamp blocks 14, and at this time, the two clamp blocks 14 can also be easily removed from the mounting hole 21.

As shown in FIG. 5, in another achievable manner, the Hall sensor fixing member 1 is an integrated structure, and the Hall sensor fixing member 1 is a cylindrical structure. A through slot 11 is provided in the Hall sensor fixing member 1, the inner walls on opposite sides of the through slot 11 are provided with protrusions 15, and the outer wall of the Hall sensor fixing member 1 is provided with a groove 13 and a limiting portion 12. The Hall sensor fixing member 1 of this integrated structure can also achieve the above functions, but attention should be paid to control the size of the limiting portion 12 to prevent the Hall sensor fixing member 1 from being difficult to be inserted into the mounting hole 21 of the Hall sensor 2.

As shown in FIG. 1 and FIG. 2, the first embodiment of the present application further provides a Hall sensor assembly, including a Hall sensor 2 and a metal piece 3. The Hall sensor 2 is provided with a mounting hole 21. The Hall sensor assembly further includes a Hall sensor fixing member 1 as described above. The Hall sensor fixing member 1 is inserted into the mounting hole 21, and the metal piece 3 is inserted into the through slot 11. This Hall sensor assembly can be applied in the technical field of automotive industry, specifically in automotive power systems, body control systems, traction control systems, and anti-lock braking systems.

The advantages of the Hall sensor fixing member 1 and the Hall sensor assembly provided in the embodiments of the present application are as follows:

1. Good safety performance: the Hall sensor fixing member 1 is made of flame-retardant insulation elastic materials (such as flame-retardant silicone, flame-retardant rubber, etc.). Due to its excellent insulation performance, when the Hall sensor fixing member 1 is installed in a high-voltage control box, there is no need to consider the issues of insulation and electrical clearance, and there is no safety risk involved. Meanwhile, the Hall sensor fixing member 1 can meet the flame-retardant performance requirements, such as the national standard safety performance requirements of horizontal HB level and vertical V-0 level.

2. Easy to install and disassemble, with good universality of parts: the Hall sensor fixing member 1 is used to fix the Hall sensor 2 to the metal piece 3, without the need for screws, ties, and other parts to assist installation. It is only required to respectively install the two clamp blocks 14 in the mounting hole 21, and then insert the metal piece 3 to be tested into the gap between the two clamp blocks 14 to complete the installation. When the Hall sensor 2 needs to be removed from the metal piece 3, it is only required to simply pull the metal piece 3 out of the gap between the two clamping blocks 14. Therefore, the Hall sensor assembly has the advantages of easy operation and simple installation. Meanwhile, due to the standardized design and mold making for the Hall sensor fixing member 1, the consistency of the parts is good and the size is stable. Only by specifying the thickness dimension of the metal piece 3, it can be used in all high-voltage control boxes (not shown), with good universal performance.

3. Good fastening performance and high reliability: due to the elastic structure of the Hall sensor fixing member 1, when the metal piece 3 is inserted into the through slot 11, the Hall sensor fixing member 1 can undergo elastic deformation and generate squeezing force and recovery force. The squeezing force and recovery force act on the Hall sensor 2 and the metal piece 3 respectively, making the fixing between the metal piece 3 and the Hall sensor 2 more stable Meanwhile, by setting a limiting portion 12 on the Hall sensor fixing member 1, the limiting portion 12 can prevent the Hall sensor 2 from sliding on the Hall sensor fixing member 1, making the fixing between the Hall sensor 2 and the Hall sensor fixing member 1 more stable. After experimental testing and practical use verification, the Hall sensor fixing member 1 can ensure the fastening and reliability of the Hall sensor 2, meeting the installation and use requirements of the Hall sensor 2.

4. Smaller size with less space occupied: the Hall sensor fixing member 1 has a compact structure and smaller size, eliminating the bracket used to fix the Hall sensor 2, reducing the internal occupied space of the high-voltage control box, solving the problem of difficult component layout inside the high-voltage control box, reducing the external dimensions of the high-voltage control box, and improving the adaptability of the installation and layout of the high-voltage control box in the entire vehicle.

5. Simple structure and low cost: the traditional bracket used to fix the Hall sensor 2 requires structural design and drawing design based on specific usage, which requires a lot of time. Meanwhile, the bracket needs to go through multiple processes such as sheet metal cutting, bending, welding, spraying, etc. during production, which not only requires a long time but also has high manufacturing costs for the parts. However, the Hall sensor fixing member 1 in this embodiment has a simple structure and adopts standardized design, it only requires to be designed and mold-made once, thus the Hall sensor fixing member 1 can be mass-produced, thereby greatly reducing production costs while avoiding repetitive design and saving labor costs.

The above are only the specific embodiments of the present application, but the scope of protection of the present application is not limited to this. Any technical personnel familiar with this technical field who can easily think of changes or replacements within the scope of technology disclosed in the present application should be covered within the scope of protection of the present application. Therefore, the protection scope of the present application should be based on the protection scope of the claims.

INDUSTRIAL APPLICABILITY

The Hall sensor fixing member provided in this application is made of an elastic material, and there is a through slot in the Hall sensor fixing member. The size of the through slot is smaller than that of the metal piece. When the metal piece is inserted into the through slot by squeezing, the metal piece can form a squeezing effect on the Hall sensor fixing member. The Hall sensor fixing member is elastically deformed and expands outward under the squeezing effect of the metal piece. Meanwhile, the Hall sensor fixing member forms a squeezing effect on the inner wall of the Hall sensor, so that the Hall sensor, the Hall sensor fixing member and the metal piece are fixed together, thereby fixing the Hall sensor to the metal piece. When it is necessary to remove the Hall sensor from the metal piece, it is only required to simply pull the metal piece out of the through slot.

The Hall sensor fixing member provided in this application not only has good safety performance, easy installation and disassembly, good fastening performance, and high reliability, but also has a simple structure and good universality, and with only one-time design and mold making, it can be mass-produced, greatly reducing production costs. Meanwhile, the bracket used to fix the Hall sensor is eliminated, reducing the internal occupied space of the high-voltage control box, solving the problem of difficult component layout inside the high-voltage control box, reducing the external dimensions of the high-voltage control box, and improving the adaptability of the installation and layout of the high-voltage control box in the entire vehicle.

What is claimed is:

1. A Hall sensor fixing member for fixing a Hall sensor to a metal piece, the Hall sensor being provided with a mounting hole for inserting the Hall sensor fixing member, wherein the Hall sensor fixing member is made of an elastic material, a through slot is provided in the Hall sensor fixing member along the axial direction for inserting the metal piece, a size of the through slot is smaller than that of the metal piece; when the metal piece is inserted into the through slot by squeezing, the Hall sensor fixing member is elastically deformed and expands outward under squeezing effect of the metal piece, causing an outer wall of the Hall sensor fixing member to abut against and be fixed to an inner wall of the mounting hole of the Hall sensor; and wherein the outer wall of the Hall sensor fixing member is provided with a groove, and the Hall sensor is clamped in the groove during fixing, the outer wall of the Hall sensor fixing member at the position of the groove abuts against the inner wall of the Hall sensor.

2. The Hall sensor fixing member as claimed in claim 1, wherein the Hall sensor fixing member has a columnar structure.

3. The Hall sensor fixing member as claimed in claim 2, wherein the Hall sensor fixing member has a cylindrical structure.

4. The Hall sensor fixing member as claimed in claim 1, wherein the outer wall of the Hall sensor fixing member protrudes radially to form a limiting portion, and the limiting portion is used to abut against an end face of the Hall sensor.

5. The Hall sensor fixing member as claimed in claim 4, wherein the limiting portion comprises a first limiting portion and a second limiting portion which are spaced apart from each other, the first limiting portion and the second limiting portion respectively correspond to two ends of the Hall sensor fixing member, the first limiting portion and the second limiting portion respectively abut against two end faces of the Hall sensor.

6. The Hall sensor fixing member as claimed in claim 5, wherein the outer wall of the Hall sensor fixing member is provided with a groove, and the groove is provided between the first limiting portion and the second limiting portion, and the Hall sensor is clamped in the groove, the outer wall of the Hall sensor fixing member at the position of the groove abuts against the inner wall of the Hall sensor.

7. The Hall sensor fixing member as claimed in claim 1, wherein the Hall sensor fixing member comprises at least two clamp blocks that are separated from or connected to each other, when the at least two clamp blocks are inserted into the mounting hole, a gap is formed between the at least two clamp blocks, and the through slot is formed by the gap.

8. The Hall sensor fixing member as claimed in claim 7, wherein the number of the clamping blocks is two, and the two clamping blocks are arranged opposite to each other, and the through slot is formed by a gap between the two clamping blocks.

9. The Hall sensor fixing member as claimed in claim 1, wherein an uneven structure is provided on an inner wall of the through slot for easy insertion and removal of the metal piece.

10. The Hall sensor fixing member as claimed in claim 9, wherein the uneven structure comprises multiple protrusions that are spaced apart from each other, the protrusions are elongated structures extending along the axial direction of the Hall sensor fixing member, a concave is formed between adjacent two protrusions.

11. A Hall sensor assembly comprising a Hall sensor and a metal piece, the Hall sensor being provided with a mounting hole, wherein the Hall sensor assembly further comprises the Hall sensor fixing member as claimed in claim 1, the Hall sensor fixing member is inserted into the mounting hole, and the metal piece is inserted into the through slot.

* * * * *